United States Patent [19]
Jang et al.

[11] Patent Number: 5,731,241
[45] Date of Patent: Mar. 24, 1998

US005731241A

[54] SELF-ALIGNED SACRIFICIAL OXIDE FOR SHALLOW TRENCH ISOLATION

[75] Inventors: Syun-Ming Jang, Hsin-Chu; Ying-Ho Chen, Taipei; Chen-Hua Yu, Hsin-Chu, all of Taiwan

[73] Assignee: Taiwan Semiconductor Manufacturing Company, Ltd., Hsin-Chu, Taiwan

[21] Appl. No.: 857,160

[22] Filed: May 15, 1997

[51] Int. Cl.⁶ .................................................. H01L 21/76
[52] U.S. Cl. ..................... 438/424; 438/427; 438/435; 438/437; 438/221; 438/296; 148/DIG. 50
[58] Field of Search .............................. 438/424, 427, 438/435, 437, 221, 296; 148/DIG. 50

[56] References Cited

U.S. PATENT DOCUMENTS

| | | | |
|---|---|---|---|
| 5,275,965 | 1/1994 | Manning | 437/67 |
| 5,453,395 | 9/1995 | Lur | 437/67 |
| 5,498,565 | 3/1996 | Gocho et al. | 438/427 |
| 5,536,681 | 7/1996 | Jang et al. | 437/195 |
| 5,665,635 | 9/1997 | Kwon et al. | 438/437 |

OTHER PUBLICATIONS

"Trench Isolation Technology with 1um Depth n-and p-wells for a Full-CMOS SRAM Cell with a 0.4um nt/pt spacing" by K. Ishimaru et al., 1994 Symposium VLSI Technology Digest of Technical Papers, pp. 97-98 (1994).

*Primary Examiner*—Trung Dang
*Attorney, Agent, or Firm*—George O. Saile; Stephen B. Ackerman; William J. Stoffel

[57] ABSTRACT

The present invention provides a method of manufacturing a sacrificial self aligned sub-atmospheric chemical vapor deposition (SACVD) O₃ TEOS layer 50 70 over a trench oxide 40 to protect the trench oxide from excessive subsequent etch steps. The SACVD O₃ TEOS layer has a higher deposition rate over the trench oxide layer 40 than over the surrounding non-trench thermally grown pad oxides. The trench oxide is preferably formed using a process of PECVD, LPTEOS, or O₃-TEOS. The invention provides two preferred embodiments: (1) a first self aligned sacrificial O₃ TEOS oxide layer 50 deposited before the pad oxide etch and (2) a second self aligned sacrificial O₃ TEOS oxide layer 70 deposited before the sacrificial implant oxide etch. The invention can be applied in a variety of situations where the trench oxide is exposed to damaging etches.

22 Claims, 8 Drawing Sheets

SELF-ALIGNED SACRIFICIAL OXIDE FOR SHALLOW TRENCH ISOLATION

BACKGROUND OF INVENTION

1) Field of the Invention

This invention relates generally to the fabrication of isolation regions in semiconductor devices and more particularly to the fabrication of shallow trench isolation regions using selective oxide deposition techniques.

2) Description of the Prior Art

The fabrication of an integrated circuit normally begins by processing the semiconductor substrate to divide the surface area into regions where active devices and substrate embedded interconnects are to be formed, and other regions of dielectric which electrically separate the active device regions. The field oxide dielectric material is routinely silicon dioxide. Though various field oxide formation techniques have been developed and described, the technique commonly known as the localized oxidation of silicon (LOCOS) remains common in the semiconductor industry. In the practice of LOCOS, the active regions of the silicon substrate are masked by a silicon nitride layer, while the field oxide regions are thermally oxidized to form a field dielectric region. Though fundamentally simple and efficient, the LOCOS process and its progeny, such as the FUROX, PBL, and SWAMI techniques, exhibit deficiencies which reduce yield or performance in the final semiconductor chip product. Many of these processes are still plagued by the bird's beak problem.

Figure 8A:
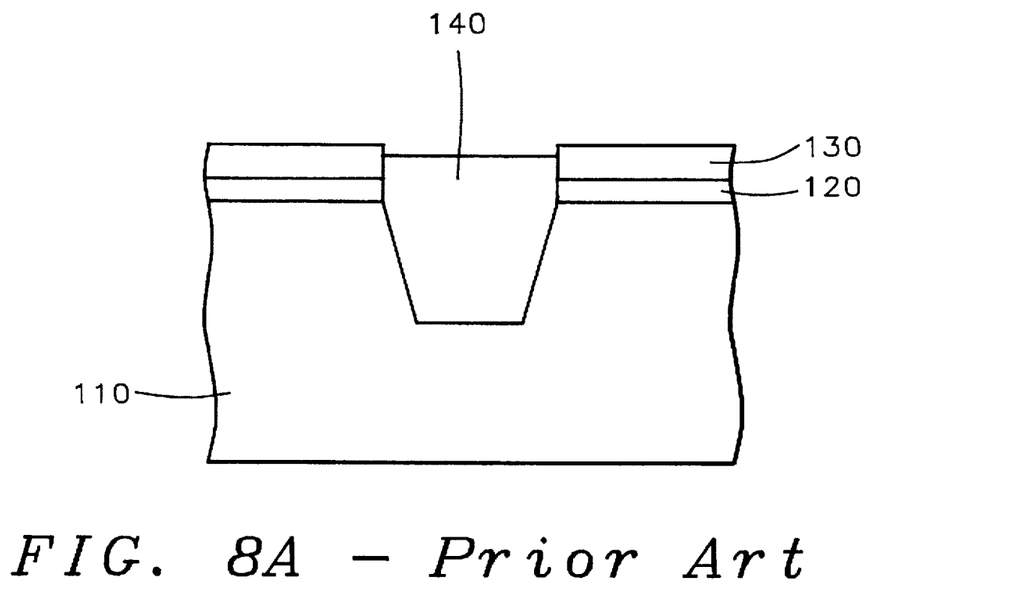
FIG. 8A is a cross sectional view illustrating a conventional method for forming a trench oxide before a subsequent etch.

To overcome some of the limitations of the LOCOS process, the shallow trench and refill isolation (STI-shallow trench isolation) structure was developed. As shown in FIG. 8A, the conventional STI process starts by forming a pad oxide layer and a nitride layer over a substrate surface. The pad oxide and nitride layer are patterned using conventional photolithographic techniques to form an opening over the area which isolation is to be formed. Next, a relatively shallow trench is etched into a silicon substrate. The trench can be etched using a dry anisotropic etch, which produces a precise trench pattern. The trench is refilled with an insulator material 140. The trench is planarized after refill to complete the STI structure. Because the bird's beak problem is not present and channel -stop dopant redistribution is reduced, a smaller isolation spacing is possible than with LOCOS.

Figure 8B:
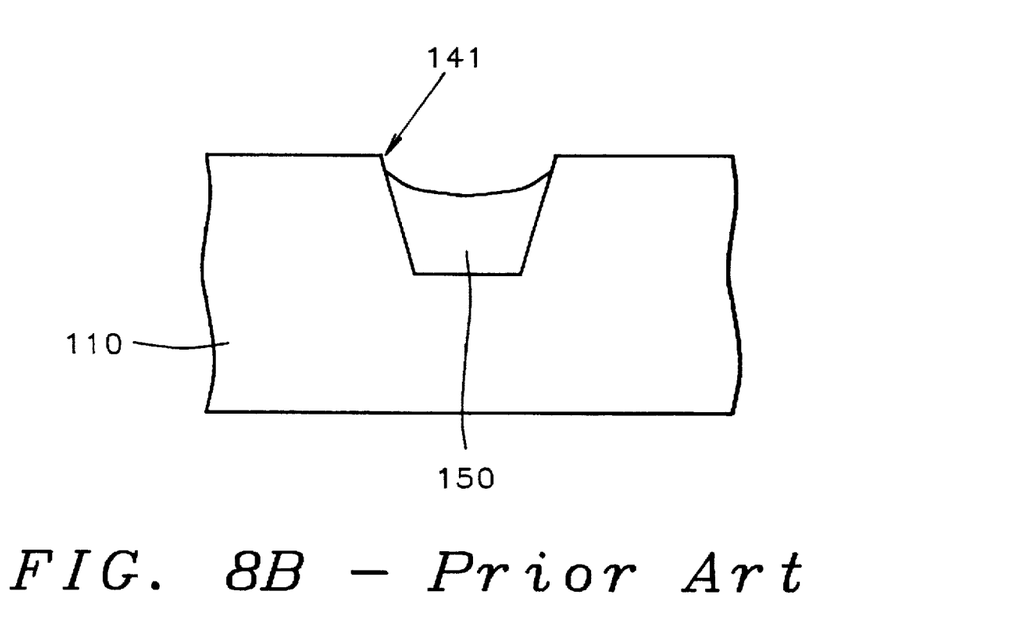
FIG. 8B shows a conventional method for etching a pad oxide off and excessively etching the trench oxide thereby exposing the sharp trench edges according to a conventional method.

After the trench oxide 140 is formed, devices overlying the active areas are formed. The trench oxide is etched several times in etch back processes, such as in pad oxide removal, self aligned contact (SAC) oxide removal, LLD spacer etches and in etchback or CMP planarizations. However, these etch back processes remove oxide 150 from the trench as shown in FIG. 8B. The reduced oxide 150 can cause shorts and yield losses. As shown in FIG. 8, the oxide loss exposes the sharp corners 141 of the substrate and the sidewalls of the trench. In the areas around the sharp corners 141, the gate oxide has a low breakdown voltage. Also, the sharp corners 141 create a high electrical field which causes leakage currents.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,275,965 (Manning) which shows a method of forming a shallow trench isolation (STI) using a gated sidewall. U.S. Pat. No. 5,536,681 shows a gap filling method using PE-OX/ ozone TEOS filling by selective $N_2$ treatment on the PE-OX. U.S. Pat. No. 5,453,395 (Lur) shows a method of forming an isolation structure using Liquid phase deposition which is capable of selectively deposition oxide only in the trenches. The article "Trench Isolation Technology with 1 µm Depth n- and p-wells for a full-CMOS SRAM cell with a 0.4 µm n+/P+ spacing" by K. Ishimaru et al., 1994 Symposium VLIS Technology Digest of Technical Papers, p. 97–98 (1994) describes a 0.7 µm depth Shallow Trench Isolation (STI) with $SiO_2$ filling, using shallow p and n wells with retrograde profiles. A rounded trench edge shape was realized by a 35 nm thick oxide under 900° C. HCL ambient.

However, these methods are complicated and do not adequately solve the shape edge 141 problem of the shallow trench isolation (STI).

SUMMARY OF THE INVENTION

It is an object of the present invention to provide a method for forming a trench oxide layer that completely fills a shallow trench thereby covering the sharp trench edges and reducing leakage currents.

It is an object of the present invention to provide a method for forming a sacrificial oxide layer that selectively deposits over the trench oxide and protects the trench oxide from subsequent etch steps thereby covering the sharp trench edges and reducing leakage currents.

To accomplish the above objectives, the present invention provides a method of manufacturing a sacrificial self aligned sub-atmospheric chemical vapor deposition (SACVD) $O_3$ TEOS layer 50 over the trench oxide 40 that protects trench oxide from excessive etching. The sacrificial $O_3$ TEOS layer and trench oxide layer 40 ensure that the sharp trench edges are covered thereby reducing leakage currents. The SACVD $O_3$ TEOS layer has a higher deposition rate over the trench oxide layer than over the surrounding non-trench oxides (e.g., thermally grown pad oxides). The trench oxide is preferably formed using a process of (e.g., PECVD, LPTEOS, $O_3$-TEOS, HDPCVD (high density plasma chemical vapor deposition) or PEOx/$N_2$ treatment/$O_3$-TEOS). The sacrificial SACVD oxide layer of the invention can be formed over the trench oxide before any etch that etches trench oxide. The invention provides two preferred embodiments: (1) a sacrificial $O_3$ Teos oxide layer 50 deposited before the pad oxide etch, and/or (2) a sacrificial oxide layer 70 deposited before the sacrificial implant oxide etch.

The first embodiment of a method of fabricating a shallow trench isolation (STI) having a self-aligned sacrificial oxide layer 50 over a trench oxide 40 comprises the steps of:

a) thermally oxidizing a semiconductor substrate 10 forming pad oxide layer 20; the substrate having at least an isolation area 12 and an active area 14;

b) depositing a masking layer 30 composed of silicon nitride over the pad oxide layer 20;

c) patterning the masking layer 30 and the pad oxide layer 20 exposing the substrate in the isolation area;

d) etching a trench 38 in the substrate using the masking layer 30 and the pad oxide layer 20 as a mask;

e) filling the trench 38 with a trench oxide layer 40 (e.g., PECVD, LPTEOS, $O_3$-TEOS); the trench oxide layer 40 having a property where a SACVD $O_3$ TEOS layer selectively deposits over the trench oxide layer; the trench oxide layer 40 is preferably composed of an oxide formed by a process of: PECVD, LPTEOS or $O_3$-TEOS;

f) removing the masking layer 30;

g) selectively depositing a first SACVD O$_3$ TEOS layer 50 over the Trench oxide layer 40.

The second embodiment of the invention forms the selectively deposited sacrificial SACVD O$_3$-TEOS layer 70 over the trench oxide layer 40 before any process steps that etch the trench oxide layer 40. For example, a sacrificial SACVD O$_3$-TEOS layer 70 can be formed over the trench oxide layer 40 before an etch that removes sacrificial oxide 62 over a well 66 after a well implant. An example a method of using the sacrificial SACVD O$_3$-TEOS layer of the invention before an etch is given below:

forming an implant sacrificial oxide layer 62 over the substrate surface;

forming at least a well in the active area 14 in the substrate 10;

selectively depositing a second self aligned SACVD O$_3$ TEOS layer 70 over the Trench oxide layer 40;

removing the implant sacrificial oxide layer 62 using an etch (e.g., 50:1 HF) and etching a portion of the second self aligned SACVD O3 TEOS layer 70 thereby leaving the Trench oxide layer 40 filling the trench.

The sacrificial SA CVD O$_3$ TEOS layer of the present invention protects the trench oxide from etches that would remove excessive oxide from the trench. The sacrificial self aligned chemical vapor deposition (SA CVD) O$_3$ TEOS layer deposits at a faster rate over specific oxides (e.g., PECVD, LPTEOS O$_3$-TEOS or HDPCVD oxide) than over thermal oxides. The pad oxide, sacrificial implant oxides, and other non-trench oxides layers are thermal oxides are formed covering the substrate surface. In contrast, the trench oxide 40 is formed of a different (e.g., non-thermal) oxide that allows a faster O$_3$ TEOS deposition rate thereupon. Therefore, a thicker O$_3$ TEOS layer 50 is formed over the trench oxide 40 than the surrounding oxides. This self aligned TEOS layer 50 protects trench oxides 40 from being excessively etched from subsequent etches. The trench oxide will cover the sharp trench edges thereby preventing leakage currents. The invention can be applied in a variety of situations where the trench oxide is exposed to damaging etches that thin and remove excessive amounts of trench oxide.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. The present invention provides a method of forming a trench oxide that completely fills a trench after subsequent etch steps. The invention selectively deposits a sacrificial oxide over a trench oxide so that the sacrificial oxide is removed by subsequent etches and leaves the trench filled with oxide. The invention has preferred two embodiments of forming the sacrificial oxide at different stages of semiconductor production. A first embodiment of the invention selectively deposits a SACVD O$_3$-TEOS layer over a trench oxide before an etch to remove the pad oxide. The second embodiment selectively deposits a SACVD O$_3$-TEOS layer over a trench oxide before an etch to remove the sacrificial oxide layer used for an ion implant step.

It should be will understood by one skilled in the art that by including additional process steps not described in this embodiment, other types of devices can also be included on the DRAM chip. For example, N and P wells in the P substrate can be formed therefrom. It should also be understood that the figures depict only one trench and well of a multitude of cells that are fabricated simultaneously on the substrate.

Substrate 10 is understood to possibly include a semiconductor wafer, active and passive devices formed within the wafer and layers formed on the wafer surface. The term "substrate" is mean to include devices formed within a semiconductor wafer and the layers overlying the wafer. The term "substrate surface" is meant to include the upper most exposed layers on a semiconductor wafer, such as a silicon surface, an insulating layer and metallurgy lines.

The substrate has at least an isolation area 12 and an active area 14. The shallow trench isolation (STI) will be formed in the isolation area 12. Devices will be formed in the active areas.

First Embodiment—Forming The Sacrificial O$_3$
TEOS Oxide Layer 50 Before The Pad Oxide Etch A first embodiment of the invention selectively deposits a sacrificial self-aligned oxide (SACVD) O$_3$-TEOS layer 50 over a trench oxide 40 before an etch to remove the pad oxide 20. (See FIGS. 1–3).

Figure 1:
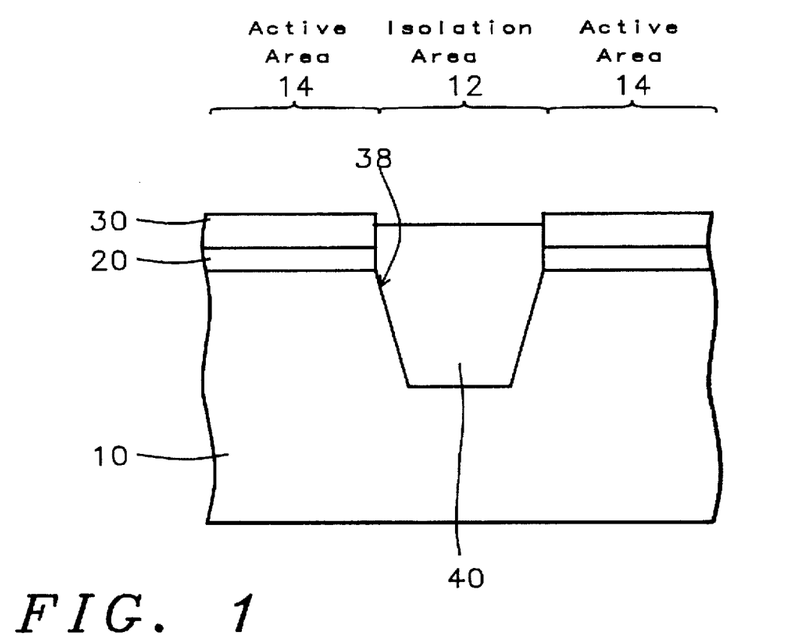
FIGS. 1 through 3 are cross sectional views for illustrating a first embodiment of the method for forming a sacrificial oxide layer 50 over a trench oxide 40 before a pad oxide etch and forming a shallow trench isolation (STI) that completely fills the trench after etch processes according to the first embodiment of the present invention.

As shown in FIG. 1, a pad oxide layer 20 is formed over a semiconductor substrate 10. Preferably the substrate is thermally oxidized to form pad oxide layer 20. The pad oxide layer 20 can be formed by any method where the sacrificial O$_3$-TEOS 50 deposits at a faster rate over the trench oxide 40 than over the pad oxide 40. The pad oxide can be formed by a wet thermal oxidation at a temperature in a range of between about 850° and 950° C. at a pressure in a range of between about 730 and 790 torr and more preferably at about 760 torr.

The pad layer can be formed of other materials, such as an oxide/polysilicon/oxide layer, or an oxide/polysilicon layer. The pad layer must be formed of a material that allows the SACVD $O_3$-TEOS layer 50 to deposit at a faster over the trench oxide than over the pad layer. In addition, the pad layer has the ability to release the high tensile stress of the overlying $Si_3N_4$ layer 30 (see below).

Next, a masking layer 30 is deposited over the pad oxide layer 20. The masking layer 30 can be composed of silicon nitride formed by a Low pressure chemical vapor deposition (LPCVD) or plasma enhanced chemical vapor deposition (PEVCD) process, and is more preferably composed of LPCVD silicon nitride.

The masking layer 30 and the pad oxide layer 20 are then patterned thereby exposing the substrate in the isolation area.

Referring to FIG. 1, a trench 38 is then etched in the substrate using the masking layer 30 and the pad oxide layer 20 as a mask. The trench preferably has a depth in a range of between about 3000 and 5000 Å and a width between about 0.3 µm and 10 µm and more preferably greater than 0.3 µm.

Next, preferably, a thermal oxide layer (not shown) is formed in the trench. The thermal oxide layer preferably has a thickness in a range of between about 300 and 400 Å.

Figure 2:
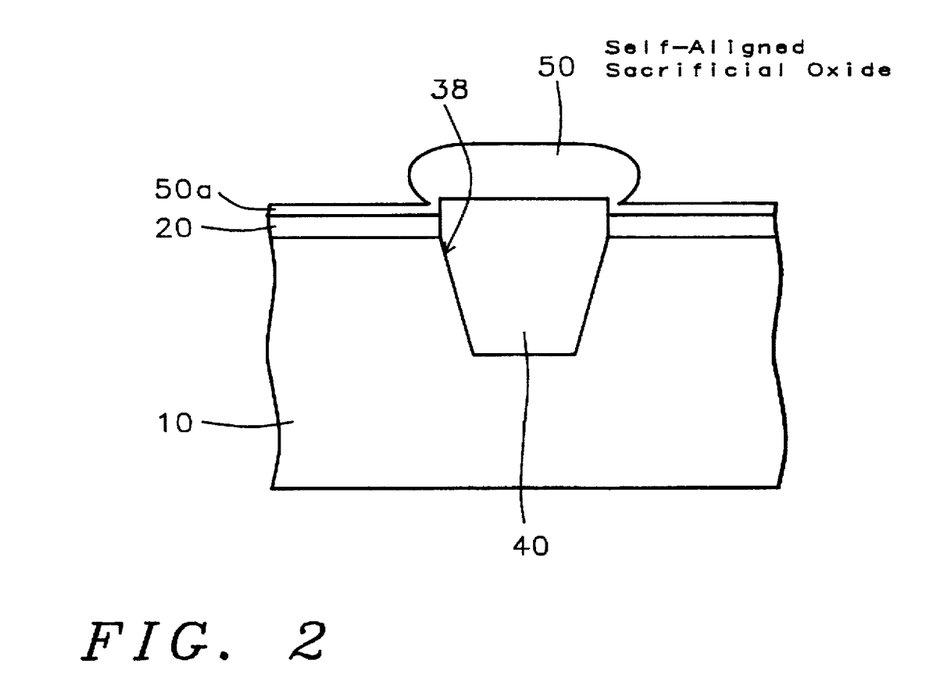

In an important step, as shown in FIG. 2, the trench 38 is filled with a trench oxide layer 40. The trench oxide layer 40 has a property where a SACVD $O_3$ TEOS layer 50 selectively deposits over the trench oxide layer 40. The trench oxide layer 50 can be formed by any method where the sacrificial $O_3$-TEOS 50 deposits at a faster rate over the trench oxide 40 than over the surrounding non-trench oxide (e.g., pad oxide 40). The trench oxide 40 can be formed using for example, HDPCVD oxide, $O_3$ TEOS, or a sandwich structure of thermal oxide/$N_2$ treated thermal oxide/ SACVD $O_3$ TEOS (See FIGS. 7A–7D).

A trench oxide layer formed using a HDPCVD (high density plasma chemical vapor deposition) process is preferably formed at a argon flow between about 15 and 25 sccm, a $O_2$ flow between about 35 and 45 sccm and a $SiH_4$ flow between about 25 and 35 sccm with a source plasma frequency of between about 190 Mhz and 210 Mhz and a source power between about 3400 and 3600 Watts, and a bias power of between about 13.25 MHZ and 13.75 Mhz and a bias power between about 1500 Watts.

The trench oxide layer 40 is preferably formed using a $O_3$ TEOS process at a temperature in a range of between about 360° and 440° C. and a pressure in a range of between about 400 and 600 torr and a TetraEthylOrthoSilicate (TEOS) flow of between 1700 and 2300 sccm (tgt about 2000 sccm), and a $O_3$ in $O_2$ flow of between 4500 and 5500 sccm (tgt=5000 sccm) with a $O_3$ in $O_2$ wt % ratio between 12 and 13 weight % (tgt about 12.5 wt %).

Figure 7A:
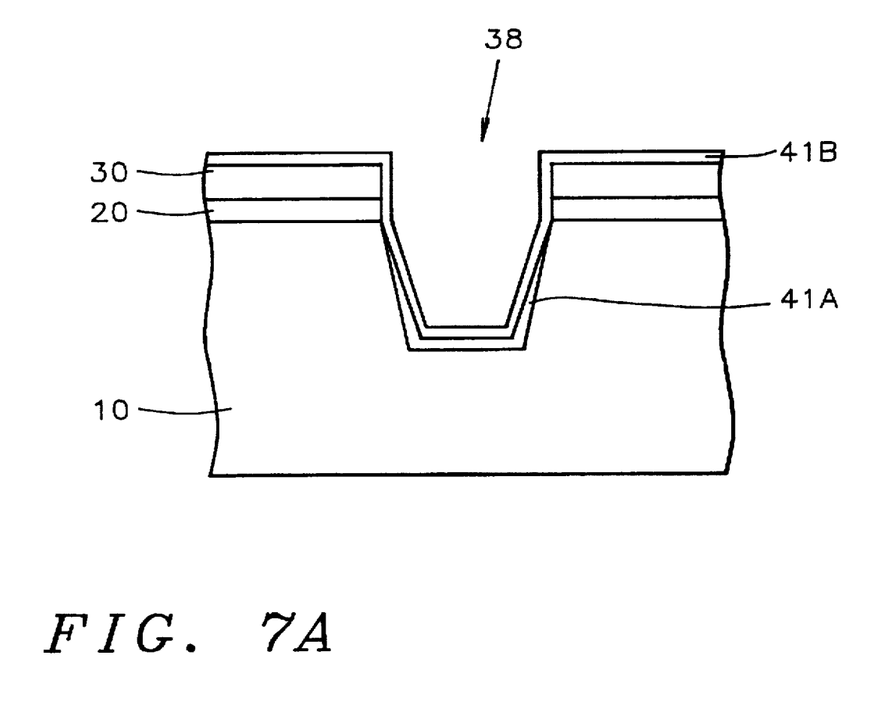
FIG. 7A, 7B, 7C, and 7D are cross sectional views for illustrating preferred method of method for forming a trench oxide according to the method of the current invention.

As shown in FIGS. 7A–7D, A preferred structure/method of forming the trench oxide 40 comprises an PE thermal oxide treated with a $N_2$ plasma process which is covered by a $O_3$ TEOS oxide layer (E.g., sandwich structure of thermal ox/PECVD ox/$N_2$ treatment/$O_3$-TEOS oxide). As shown in FIG. 7A, a pad oxide 20 and nitride masking layer 30 are formed over a substrate as described above. A trench 38 is formed in the substrate as described above. Next, a thermal oxide layer 41A is formed in the trench. The thermal oxide layer 41 preferably has a thickness in a range of between about 300 and 400 Å. After this, a PE oxide layer 41B preferably formed using $SiH_4$ is formed over at least the thermal oxide 41A. The PE oxide layer 41B preferably has a thickness in a range of between about 350 and 600 Å.

Figure 7B:
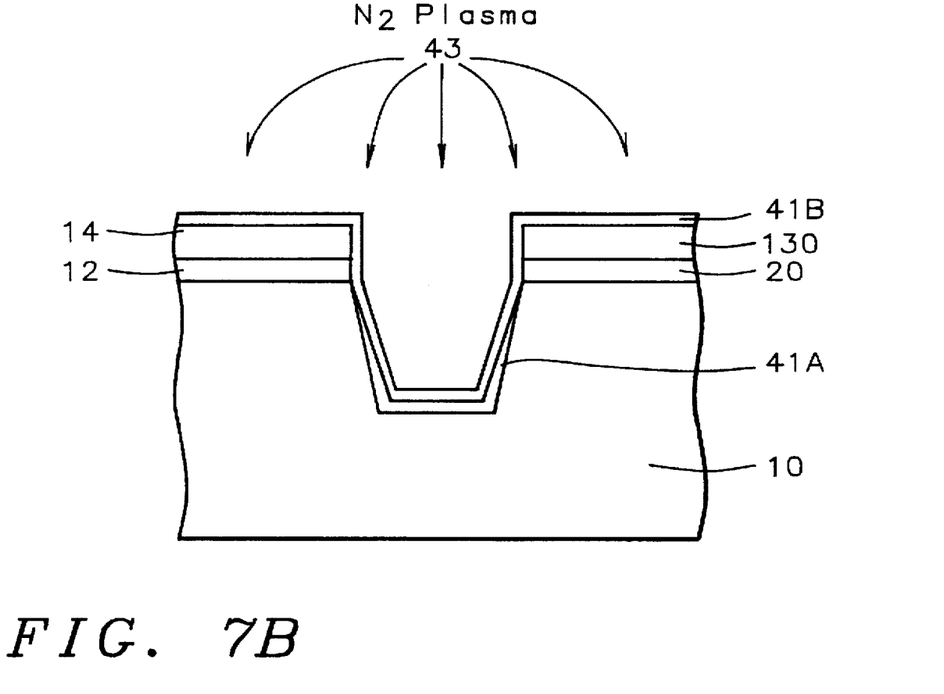

Turning to FIG. 7b, the PE oxide layer 41b is treated with a $N_2$ plasma 43. The $N_2$ plasma is critical to the process. The $N_2$ plasma process preferably comprises a $N_2$ plasma at a power/frequency in a range of between about 13.56 Mhz/ 100 W and 350 MHZ/450 Watts, and at a pressure in a range of between about 1 and 2 torr and a $N_2$ flow rate between about 400 and 600 sccm and a He flow rate between about 1900 and 2100 sccm for between about 50 and 70 seconds.

Figure 7C:
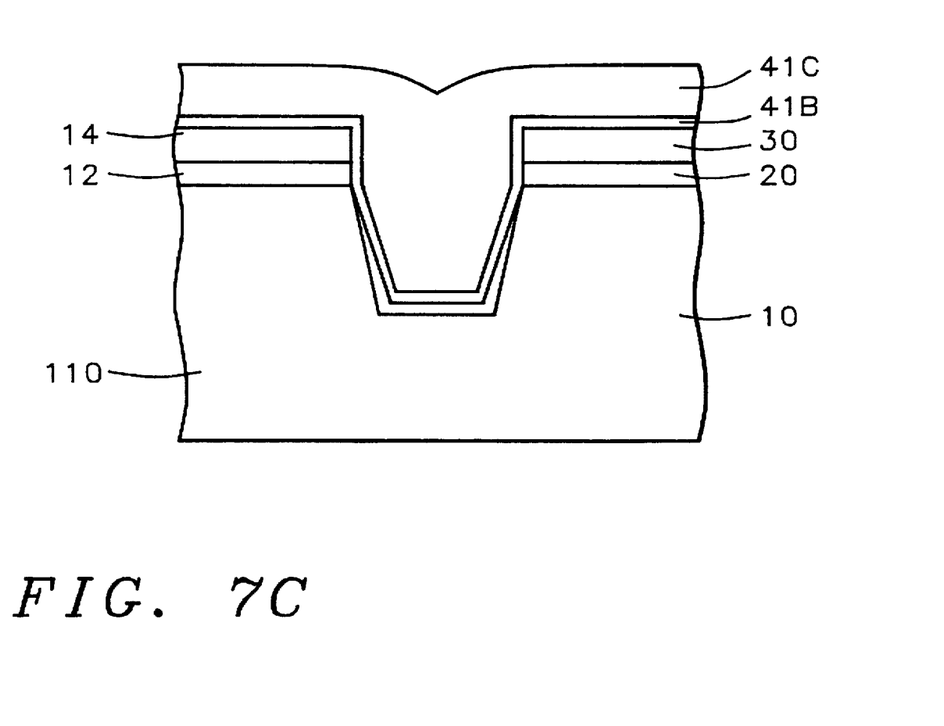
Figure 7D:
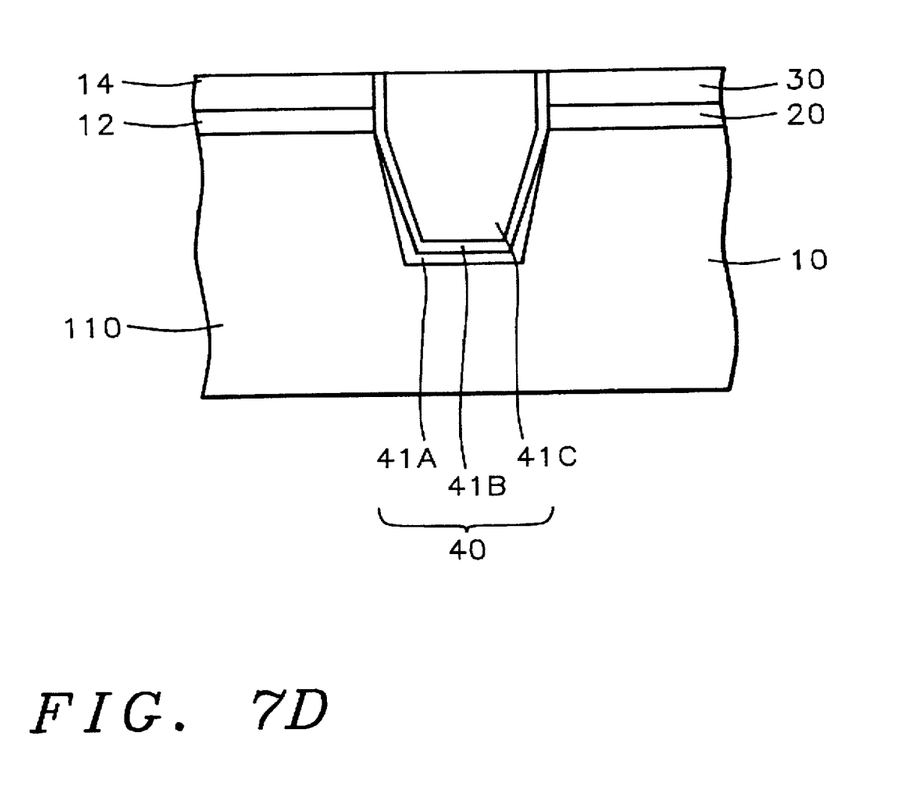

As shown in FIG. 7C, a SACVD TEOS layer 41C is formed filling the trench and over the PE oxide layer 41B. The SACVD (sub atmospheric chemical vapor deposition) TEOS layer 41C preferably has a thickness in a range of between about 5000 and 7000 Å. Because of the $N_2$ treated PE oxide, the bottom and sidewall coverage will be 100%. Next, as shown in FIG. 7d, the SACVD TEOS layer 41C is planarized preferably by a chemical-mechanical polish process. This trench filling technique/composition is preferred because the SACVD TEOS layer 41C best smoothly fills the trench when it is deposited over a $N_2$ treated PE oxide layer 41B.

The trench oxide can also comprise at least two oxide layers 40 and (40A or 40B), with the top oxide layer 40A or 40B having a property where the sacrificial oxide layer 50 selectively deposits over the top oxide layer. See FIGS. 6c and 6d and text below. The top oxide layer 40A is preferably composed of an oxide formed by a process selected from the group consisting of $O_3$ TEOS and $N_2$ treated thermal oxide.

After the trench oxide 40 is formed and polished, the masking layer 30 is preferably removed.

Turning to FIG. 2, a first self aligned sacrificial SACVD $O_3$ TEOS layer 50 is selectively deposited over the trench oxide layer 40. The first self aligned SACVD $O_3$ TEOS layer 50 has a faster deposition rate over the Trench oxide layer 40 than over the pad oxide layer 20. The first SACVD $O_3$ TEOS layer 50 has a deposition ratio (trench oxide deposition rate: pad oxide deposition rate) of between about 10:1 to 15:1.

The first SACVD $O_3$ TEOS layer 50 is preferably deposited at a pressure between about 400 and 500 torr and more preferably about 450 torr, at a temperature in a range of between about 360° and 440° C., using TEOS, and $O_2$ (or oxygen containing gasses) at a $O_3$ in $O_2$ weight % between about 12 and 15 wt % (tgt=12.5 wt %).

Examples of SACVD $O_3$ TEOS deposition rates over various compositions of trench oxide 40 40A is shown in FIG. 6.

TABLE 1

Surface Sensitivity/TEOS Deposition Rate - Of The Invention's SACVD TEOS Layer 50 70 (450 Torr) Over Various Trench Oxide 40 Surface Compositions

Figure 6A:
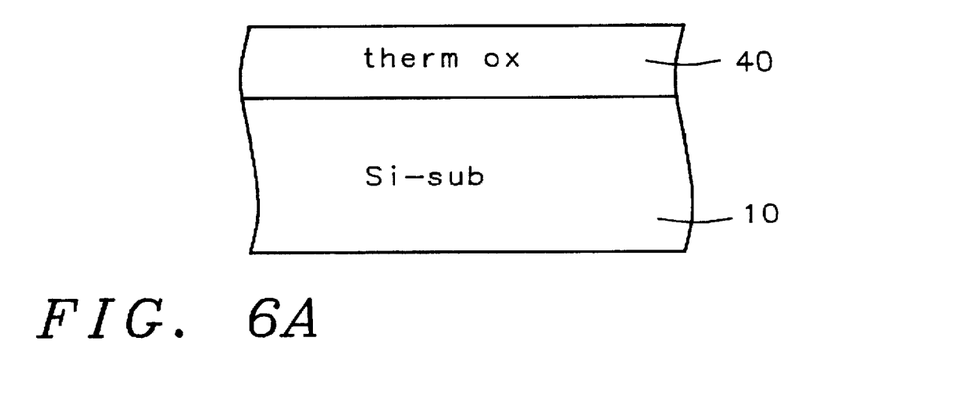
FIGS. 6A, 6B, 6C, and 6D are cross sectional views corresponding to the surfaces described in Table 1 that show the O$_3$ TEOS sacrificial oxide 50 deposition rates over various trench oxide layers 40 according to the process of the invention.
Figure 6B:
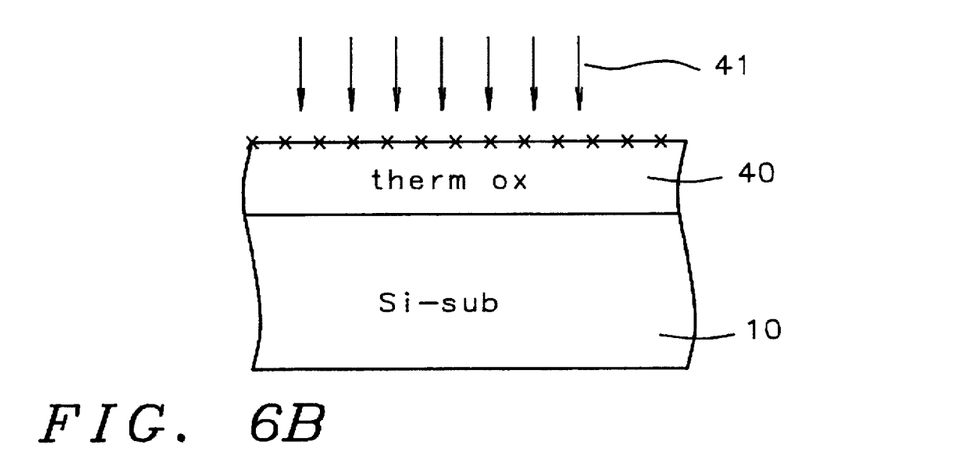
Figure 6C:
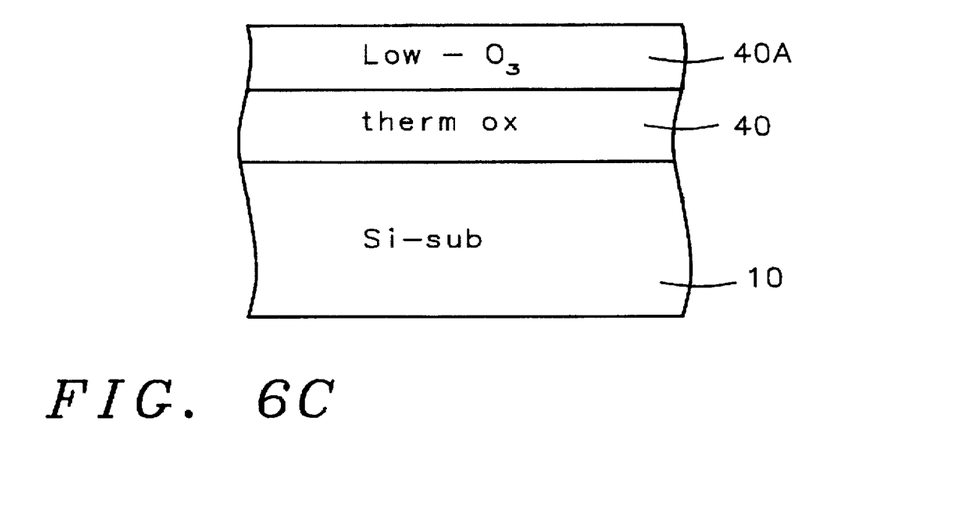
Figure 6D:
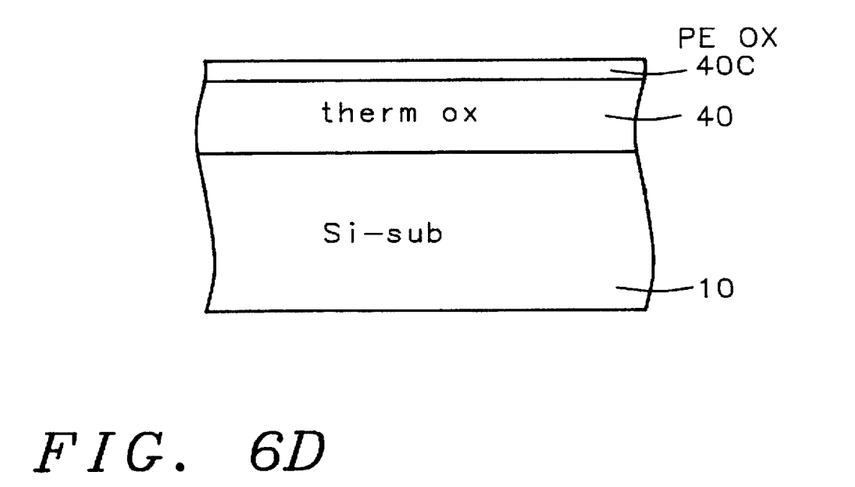

| $O_3$ TEOS dep rate (Å/min) | 120 | 1530 | 1670 | 1600 |
|---|---|---|---|---|
| Surface (figure shown in) | Thermal ox over SI - (FIG. 6A) | $N_2$ (41) plasma treated ox 40 over Si - FIG. 6B | Low $O_3$ (60 torr & 1000 Å) over thermal oxide over SI - FIG. 6c | (0.5K Å) PE-ox (40 C.) over thermal ox over SI- FIG. 6D |

The first self aligned SACVD $O_3$ TEOS layer 50 is preferably deposited over the Trench oxide layer 40 at a rate between about 1500 and 1900 Å/min and more preferably of about 1700 Å/min and over the pad oxide layer at a rate between about 120 and 160 Å/min and more preferably of about 140 Å/min. See FIG. 2.

The first self aligned SACVD $O_3$ TEOS layer 50 preferably has a thickness in a range of between about 500 and 700 Å. The final thickness of the first SACVD $O_3$ TEOS layer 50 is determined by the actual etches that follow so that the trench oxide 40 is protected by the sacrificial oxide 50.

It is not clear why, in fact unexpected, the self aligned sacrificial $O_3$ TEOS layer 50 of the invention deposits faster over the non-thermal field oxide layers 50. It is thought that the $O_3$-TEOS layer on thermal oxide has a severe surface sensitivity.

Figure 3:
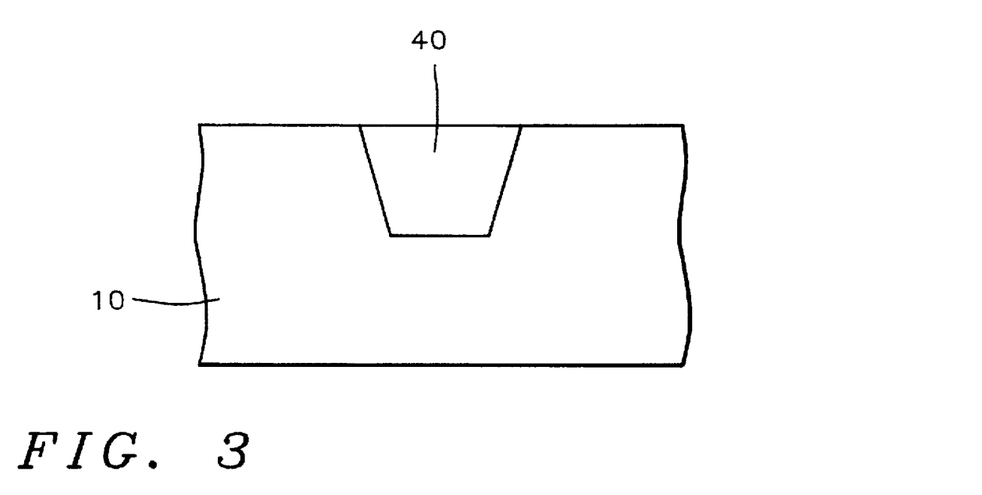

Referring to FIG. 3, the pad oxide layer 20 and the first SACVD $O_3$ TEOS layer 50 are etched to remove the pad oxide layer 20. The etch removes all of the pad oxide layer 20 and removes at least a portion of the first SACVD $O_3$ TEOS layer 50 and more preferably removes all of the first SACVD $O_3$ TEOS layer 50. A main point of the invention (layer 50) is to prevent the etches from exposing sharp edges 141 of the substrate as shown in FIG. 8.

The etch preferably comprises a 50:1 HF etch. The etch selectivity between the $O_3$ TEOS layer and the pad oxide layer (OS-TEOS: Thermal oxide) is preferably between about 5:1 and 7:1 and more preferably about 6:1.

Second Embodiment—Sacrifical $O_3$ TEOS Layer Formed Before An Etch To Remove The Sacrificial Oxide Layer 62

The second preferred embodiment of the invention selectively dseposits a SACVD $O_3$-TEOS layer 70 over a trench oxide before an etch to remove the sacrificial oxide layer 62 used for an implant step.

Figure 4:
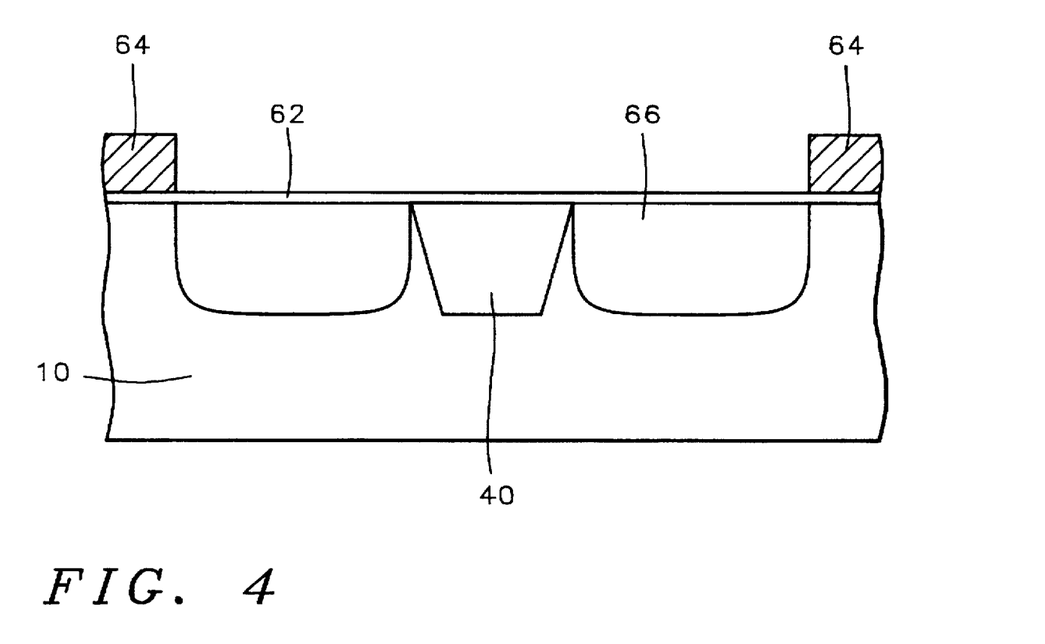
FIGS. 4, 5A, and 5B are cross sectional views for illustrating a second embodiment of the method for forming a sacrificial oxide layer 70 over a trench oxide before an I/I sacrificial oxide layer etch and forming a shallow trench isolation (STI) that completely fills the trench after etch processes according to the present invention.

As shown in FIG. 4, a field oxide layer 40 is formed in the substrate. The field oxide layer 40 can be formed of the same materials and processes as described above in the first embodiment.

As shown in FIG. 4, an implant sacrificial oxide layer 62 is formed over the substrate surface. The implant sacrificial oxide layer 62 is preferably formed by a Wet or dry thermal process. The implant sacrificial oxide layer preferably has a thickness in a range of between about 100 and 130 Å.

Next, at least a well 62 is formed in the active area 14 in the substrate 10. The well can be n or P type. Also, more than one type well can be formed using different combinations of photo and masking processes. For illustration purposes, the figure shows one well 66 type. For example, a photo layer 64 with openings over the area where wells implant are desired can be formed over the implant sacrificial layer 62. An implant can be performed to form wells 66 in the active areas 14 in the substrate.

Figure 5A:
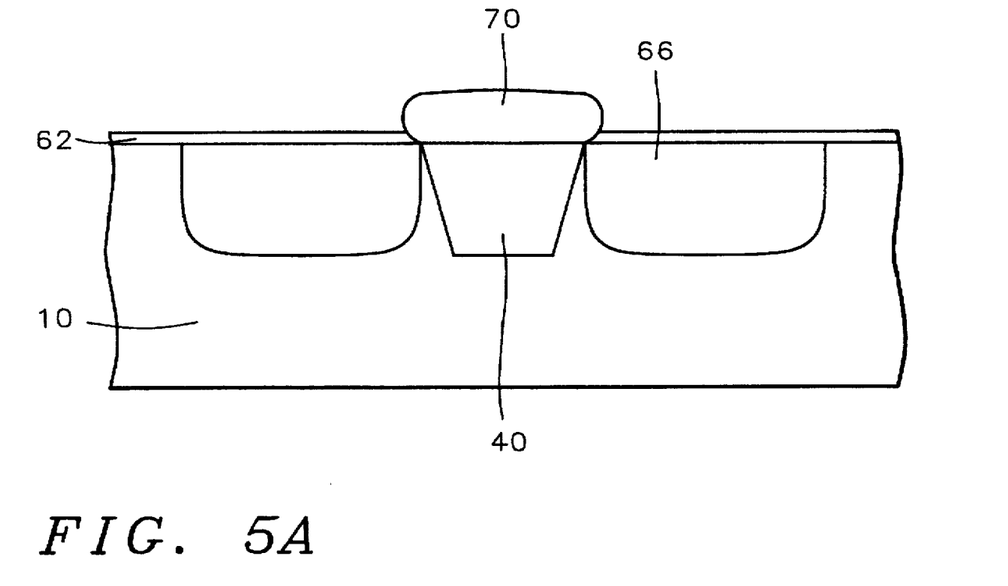

Referring to FIG. 5A, a second SACVD $O_3$ TEOS layer 70 (e.g., 50) is selectively deposited over the trench oxide layer 40. The second SACVD $O_3$ TEOS layer 70 (50) can be deposited as described above in the first embodiment. The a second SACVD $O_3$ TEOS layer 70 preferably has a thickness in a range of between about 500 and 700 Å. The thickness of the second SACVD $O_3$ TEOS layer 70 can be varied to compensate for the thickness of the implant sacrificial layer 62 and the etch selectivity.

Figure 5B:
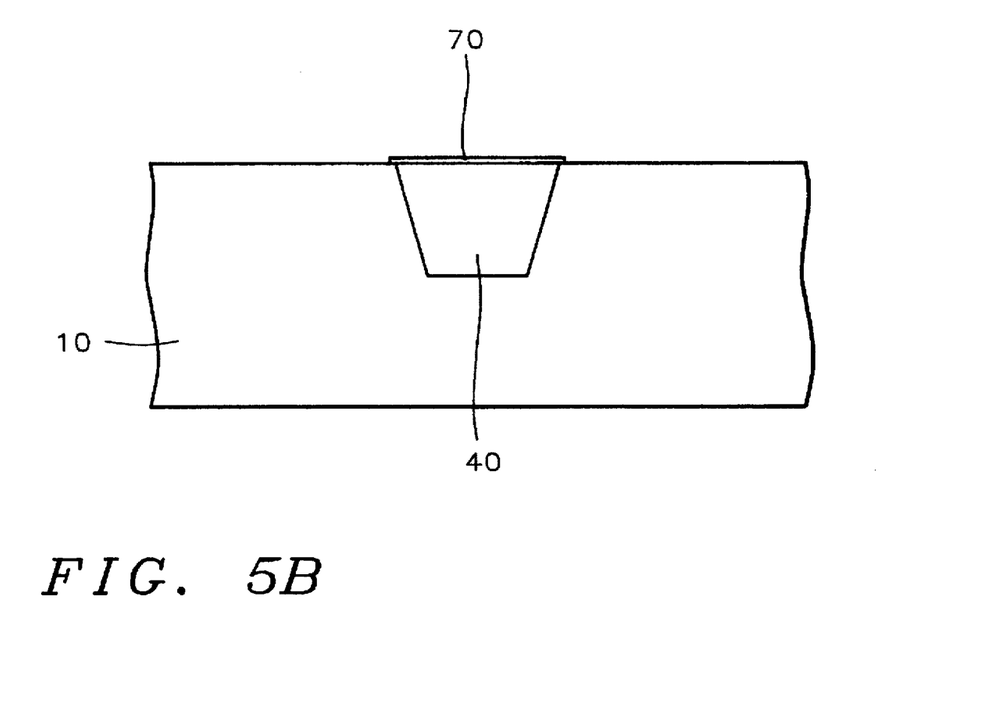

Subsequently, as shown in FIG. 5B, the implant sacrificial oxide layer 62 is preferably removed using an etch (e.g., 50:1 HF). A portion of the second self aligned SACVD $O_3$ TEOS layer 70 is removed thereby leaving the trench oxide layer 40 filling the trench 38 about level with the substrate surface. A main point of the invention (layer 50) is to prevent the etches from exposing sharp edges 141 of the substrate as shown in FIG. 8B.

The sacrificial SA CVD $O_3$ TEOS layer 50 70 of the present invention protects the trench oxide from etches that would remove excessive oxide from the trench. This prevents the sharp trench edges 141 from protruding through the trench oxide and causing leakage currents. The sacrificial self aligned chemical vapor deposition (SA CVD) $O_3$ TEOS layer deposits at a faster rate over specific oxides (e.g., PECVD, LPTEOS, $O_3$-TEOS) than over thermal oxides. Since the pad oxide, sacrificial implant oxides, and other surrounding non-trench oxides layers are thermal oxides are formed covering the substrate surface and the trench oxide 40 is formed of a different oxide with a faster $O_3$ TEOS deposition rate, a thicker $O_3$ TEOS layer is formed over the trench oxide 40. The method of the invention is very effective in protecting trench oxides and is relatively easy to manufacture. The invention can be applied in a variety of situations where the trench oxide is exposed to damaging etches especially wet etch for selective etchback.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a shallow trench isolation having a protective self-aligned sacrificial $O_3$ TEOS oxide layer comprising the steps of:

a) thermally oxidizing a semiconductor substrate forming pad oxide layer; said substrate having at least an isolation area and an active area;

b) depositing a masking layer over said pad oxide layer;

c) patterning said masking layer and said pad oxide layer exposing said substrate in said isolation area;

d) etching a trench in said substrate using said masking layer and said pad oxide layer as a mask; said trench having sidewalls and a bottom;

e) filling said trench with a trench oxide layer; said trench oxide layer having a property where a SACVD $O_3$ TEOS layer selectively deposits over said trench oxide layer;

f) removing said masking layer;

g) selectively depositing a first self aligned SACVD $O_3$ TEOS layer over said trench oxide layer; and h) etching said pad oxide layer and said first self aligned SACVD $O_3$ TEOS layer and removing said pad oxide layer and removing at least a portion of said first self aligned SACVD $O_3$ TEOS layer.

2. The method of claim 1 which further includes a) forming an implant sacrificial oxide layer over the substrate surface;

b) forming at least a well in said active area in said substrate;

c) for selectively depositing a second self aligned SACVD $O_3$ TEOS layer over said trench oxide layer;

d) removing said implant sacrificial oxide layer using an etch and etching at least a portion of said second self aligned SACVD $O_3$ TEOS layer thereby leaving said trench oxide layer filling said trench.

3. The method of claim 1 wherein said trench oxide layer is formed by the following steps:

a) forming a thermal oxide layer over said sidewalls of said trench; said thermal oxide layer thickness in a range of between about 300 and 400 Å;

b) forming a PE SiH$_4$ thermal oxide layer over said thermal oxide layer; said PE SiH$_4$ thermal oxide layer thickness in a range of between about 350 and 600 Å;

c) treating said PE SiH$_4$ thermal oxide layer with a N$_2$ plasma;

d) forming a trench oxide layer composed of a O$_3$ TEOS layer in said trench and over said masking layer;

e) chemical-mechanical polish said trench oxide layer so that said trench oxide layer is level with said masking layer.

4. The method of claim 1 wherein said trench oxide layer is formed using a O$_3$ TEOS process at a temperature in a range of between about 360° and 400° C. and a pressure in a range of between about 300 and 600 torr and a TetraEthylOrthoSilicate (TEOS) flow of between 1700 and 2300 sccm, and a O$_3$ in O$_2$ flow of between 4500 and 5500 sccm with a O$_3$ in O$_2$ wt % ratio between 12 and 13 weight %.

5. The method of claim 1 wherein said trench has a depth in a range of between about 3000 and 5000 Å.

6. The method of claim 1 wherein said trench oxide layer is composed of an oxide formed by a process selected from the group consisting of LPTEOS, O$_3$ TEOS and N$_2$ treated thermal oxide.

7. The method of claim 1 wherein said first self aligned SACVD O$_3$ TEOS layer has a thickness in a range of between about 5000 and 7000 Å.

8. The method of claim 1 wherein said first self aligned SACVD O$_3$ TEOS layer has a faster deposition rate over said trench oxide layer than over said pad oxide layer 20, with a ratio of between about 5:1 to 7:1 times faster.

9. The method of claim 1 wherein said first self aligned SACVD O$_3$ TEOS layer deposited at a pressure between about 400 and 500 torr, at a temperature in a range of between about 360° and 440° C., and a TetraEthylOrthoSilicate (TEOS) flow of between 1700 and 2300 sccm, and a O$_3$ in O$_2$ flow of between 4500 and 5500 sccm with a O$_3$ in O$_2$ wt % ratio between 12 and 13 weight %.

10. The method of claim 1 wherein said first self aligned SACVD O$_3$ TEOS layer is deposited over said Trench oxide layer at a rate between about 1500 and 1900 Å/min and over said pad oxide layer at a rate between about 120 and 160 Å/min.

11. A method of fabricating a shallow trench isolation having a protective self-aligned sacrificial O$_3$ TEOS oxide comprising the steps of:

a) thermally oxidizing a semiconductor substrate forming pad oxide layer; said substrate having at least an isolation area and an active area;

b) depositing a masking layer composed of silicon nitride over said pad oxide layer;

c) patterning said masking layer and said pad oxide layer exposing said substrate in said isolation area;

d) etching a trench in said substrate using said masking layer and said pad oxide layer as a mask; said trench having sidewalls and a bottom;

e) forming a thermal oxide layer lining said sidewalls and said bottom of said trench; said thermal oxide layer having a thickness in a range of between about 300 and 400 Å;

f) filling said trench with a trench oxide layer; said trench oxide layer having a property where a SACVD O$_3$ TEOS layer selectively deposits over said trench oxide layer; said trench oxide layer formed by a process selected from the group consisting of PECVD, LPTEOS, and O$_3$-TEOS;

g) removing said masking layer;

h) selectively depositing a first self aligned SACVD O$_3$ TEOS layer over said Trench oxide layer; said first self aligned SACVD O$_3$ TEOS layer is deposited at a pressure between about 400 and 500 torr, at a temperature in a range of between about 360° and 440° C., and a TEOS flow of between 1700 and 2300 sccm, and a O$_3$ in O$_2$ flow of between 4500 and 5500 sccm with a O$_3$ in O$_2$ wt % ratio between 12 and 13 weight %;

i) etching said pad oxide layer and said first self aligned SACVD O$_3$ TEOS layer and removing said pad oxide layer and removing at least a portion of said SACVD O$_3$ TEOS layer.

12. The method of claim 11 which further includes a) forming an implant sacrificial oxide layer over the substrate surface;

b) forming at least a well in said active area in said substrate;

c) for selectively depositing a second self aligned SACVD O$_3$ TEOS layer over said trench oxide layer;

d) removing said implant sacrificial oxide layer using an etch and etching at least a portion of said second self aligned SACVD O$_3$ TEOS layer thereby leaving said trench oxide layer filling said trench.

13. The method of claim 11 wherein said trench oxide layer is formed by the following steps:

a) forming a thermal oxide layer over said sidewalls of said trench; said thermal oxide layer thickness in a range of between about 300 and 400 Å;

b) forming a PE SiH$_4$ thermal oxide layer over said thermal oxide layer; said PE SiH$_4$ thermal oxide layer thickness in a range of between about 350 and 600 Å;

c) treating said PE SiH$_4$ thermal oxide layer with a N$_2$ plasma;

d) forming a trench oxide layer composed of O$_3$ TEOS layer in said trench and over said masking layer;

e) chemical-mechanical polish said trench oxide layer so that said trench oxide layer is level with said masking layer.

14. The method of claim 11 wherein said trench oxide layer is formed using a O$_3$ TEOS process at a temperature in a range of between about 360° and 400 ° C. and a pressure in a range of between about 300 and 600 torr and a TetraEthylOrthoSilicate (TEOS) flow of between 1700 and 2300 sccm, and a O$_3$ in O$_2$ flow of between 4500 and 5500 sccm with a O$_3$ in O$_2$ wt % ratio between 12 and 13 weight %.

15. The method of claim 11 wherein said trench has a depth in a range of between about 3000 and 5000 Å.

16. The method of claim 11 wherein said first self aligned SACVD O$_3$ TEOS layer has a thickness in a range of between about 5000 and 7000 Å.

17. The method of claim 11 wherein said first self aligned SACVD O$_3$ TEOS layer has a faster deposition rate over said trench oxide layer than over said pad oxide layer, with a ratio of between about 5:1 to 7:1 times faster.

18. The method of claim 11 wherein said first self aligned SACVD O$_3$ TEOS layer deposited at a pressure between about 400 and 500 torr, at a temperature in a range of between about 360° and 440° C., and a TetraEthylOrthoSilicate (TEOS) flow of between 1700 and 2300 sccm, and a O$_3$ in O$_2$ flow of between 4500 and 5500 sccm with a O$_3$ in O$_2$ wt % ratio between 12 and 13 weight %.

19. The method of claim 11 wherein said first self aligned SACVD $O_3$ TEOS layer deposited over said trench oxide layer at a rate between about 1500 and 1900 Å/min and over said pad oxide layer at a rate between about 120 and 160 Å/min.

20. A method of fabricating a shallow trench isolation having a self-aligned sacrificial oxide comprising the steps of:

a) thermally oxidizing a semiconductor substrate forming pad oxide layer; said substrate having at least an isolation area and an active area;
   b) depositing a masking layer composed of silicon nitride over said pad oxide layer;
   c) patterning said masking layer and said pad oxide layer exposing said substrate in said isolation area;
   d) etching a trench in said substrate using said masking layer and said pad oxide layer as a mask; said trench having sidewalls and a bottom;
   e) forming a thermal oxide layer lining said sidewalls and said bottom of said trench;
   f) filling said trench with a trench oxide layer;
   g) removing said masking layer;
   h) removing said pad oxide layer;
   i) forming an implant sacrificial oxide layer over the substrate surface;
   j) forming at least a well in said active area in said substrate;
   k) for selectively depositing a second self aligned SACVD $O_3$ TEOS layer over said trench oxide layer;
   l) removing said implant sacrificial oxide layer using an etch and etching at least a portion of said second self aligned SACVD $O_3$ TEOS layer thereby leaving said trench oxide layer filling said trench.

21. The method of claim 20 wherein said trench oxide layer is formed using a $O_3$ TEOS process at a temperature in a range of between about 360° and 400° C. and a pressure in a range of between about 300 and 600 torr and a TetraEthylOrthoSilicate (TEOS) flow of between 1700 and 2000 sccm, and a $O_3$ in $O_2$ flow of between 4500 and 5500 sccm with a $O_3$ in $O_2$ wt % ratio between 12 and 13 weight %.

22. The method of claim 20 wherein said second self aligned SACVD $O_3$ TEOS layer deposited at a pressure between about 400 and 500 torr, at a temperature in a range of between about 360° and 440° C., and a TetraEthylOrthoSilicate (TEOS) flow of between 1700 and 2300 sccm, and a $O_3$ in $O_2$ flow of between 4500 and 5500 sccm with a $O_3$ in $O_2$ wt % ratio between 12 and 13 weight %.

* * * * *